United States Patent [19]

Dixon, Jr.

[11] Patent Number: 4,545,073
[45] Date of Patent: Oct. 1, 1985

[54] MILLIMETER WAVE IMAGE GUIDE BAND REJECT FILTER AND MIXER CIRCUIT USING THE SAME

[75] Inventor: Samuel Dixon, Jr., Neptune, N.J.

[73] Assignee: The United States of America as represented by the Secretary of the Army, Washington, D.C.

[21] Appl. No.: 582,193

[22] Filed: Feb. 21, 1984

[51] Int. Cl.$^4$ .......................... H03D 9/02; H01P 1/218
[52] U.S. Cl. ..................................... 455/325; 333/209; 333/211; 455/330
[58] Field of Search ............... 333/202, 208, 209, 211, 333/219, 235, 239, 248; 455/325, 328, 330

[56] References Cited

U.S. PATENT DOCUMENTS

| | | | |
|---|---|---|---|
| 3,480,888 | 11/1969 | Elliott | 333/202 |
| 3,740,675 | 6/1973 | Moore et al. | 333/202 X |
| 3,986,153 | 10/1976 | Kuno et al. | 333/239 X |
| 4,006,425 | 2/1977 | Chang et al. | 333/239 X |
| 4,342,010 | 7/1982 | Dixon, Jr. et al. | 333/219 X |

Primary Examiner—Paul Gensler
Attorney, Agent, or Firm—Anthony T. Lane; Jeremiah G. Murray; Edward Goldberg

[57] ABSTRACT

A magnetically tuned band reject filter for millimeter wave frequencies comprising a barium ferrite sphere embedded in the upper surface of a semi-insulating gallium arsenide waveguide transmission line element located on a conductive ground plane and forming thereby an image guide. A pair of high energy rare earth permanent magnets are located on the upper and lower surfaces of the waveguide element at the location of the ferrite sphere with a single tuning coil surrounding both the magnets and the waveguide and operates to bias the ferrite sphere for selective absorption of signals propagating along the transmission line. With the magnetically tuned ferrite sphere located therebetween, both an input signal and a local oscillator signal, for example, are coupled to one end of the waveguide element while receiving electronics apparatus, such as a Schottky barrier diode mixer, is located at the other end of the waveguide element.

14 Claims, 4 Drawing Figures

4,545,073

MILLIMETER WAVE IMAGE GUIDE BAND REJECT FILTER AND MIXER CIRCUIT USING THE SAME

The invention described herein may be manufactured, used and licensed by or for the Government for governmental purposes without the payment of any royalties thereon or therefor.

CROSS REFERENCE TO RELATED APPLICATION

This application is related to U.S. application Ser. No. 581,833, now issued as U.S. Pat. No. 4,511,865, entitled, "Millimeter Wave Signal Limiter", filed in the name of Samuel Dixon, Jr., the present inventor.

FIELD OF THE INVENTION

This invention relates generally to signal filters for electrical signals and more particularly to a tuned band reject filter at millimeter wave frequencies.

In many applications of communications, radar and electronics warfare countermeasure receivers, it is desirable to have a means of rejecting a portion of the electromagnetic spectrum. While frequency band reject filters are well known at lower operating frequencies, such is not generally the case in the millimeter wave frequency range.

Accordingly, it is an object of the present invention to provide an improvement in band reject filters.

It is another object of the invention to provide a band reject filter in millimeter wave frequency range.

It is still another object of the invention to provide a magnetically tuned band reject filter in the millimeter wave frequency range.

SUMMARY

Briefly, the foregoing as well as other objects of the invention are provided by a magnetically tuned ferromagnetic element such as a barium ferrite sphere embedded in a semi-insulating dielectric waveguide comprised of, for example, gallium arsenide located on a conductive ground plane forming thereby an image guide transmission line structure. Electromagnet means comprising a pair of rare earth magnets and a tuning coil surrounding the magnets are located on the waveguide in close proximity to the ferrite sphere for tuning, i.e. biasing the ferrite sphere to ferromagnetic resonance, whereupon frequencies to be rejected drive the ferrite material into a coupling mode whereby the undesired energy is absorbed while out of band frequencies pass with substantially little or no attenuation.

DESCRIPTION OF THE PREFERRED EMBODIMENT

Figure 1:
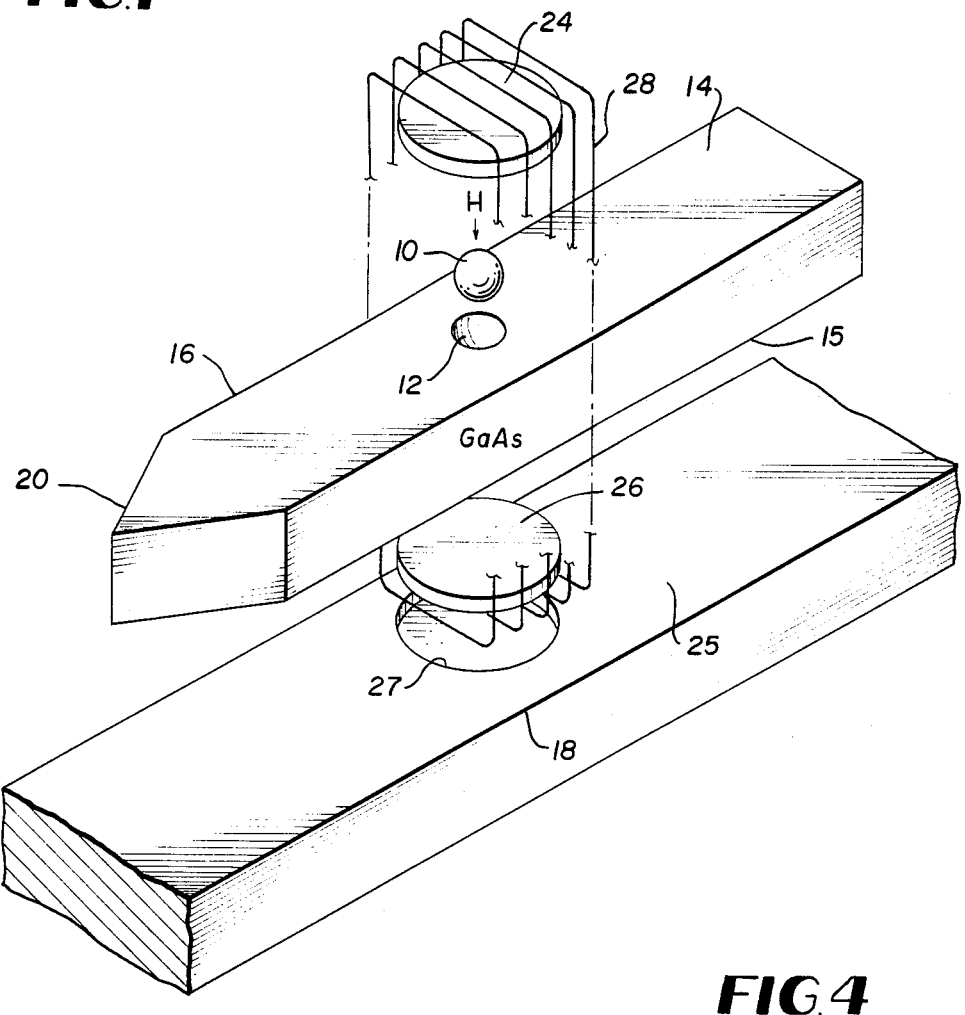
FIG. 1 is an exploded perspective view of a millimeter wave device generally illustrative of the details of the subject invention.

Referring now to the drawings and more particularly to FIG. 1, a high anisotropy single crystal barium ferrite sphere 10, having relatively broad spectral line widths, is embedded in a spherical cavity 12 formed in the upper surface 14 of a dielectric transmission medium comprised of a millimeter wave transmission line element 16 located on a metallic ground plane 18. The millimeter wave transmission line element 16 is comprised of a length of semi-insulating dielectric material, preferably a group III-V compound such as gallium arsenide (GaAs), which when placed on the metallic ground plane 18, forms an image guide.

Further as shown in FIG. 1, the gallium arsenide (GaAs) transmission line element 16 is of generally rectangular cross section and has a tapered input end 20 where electrical energy in the form of millimeter wave frequency signals can be launched for propagation. The cavity 12 for receiving the ferrite sphere 10 is located along the center line of the GaAs waveguide element 16 and the dielectric constant of the ferrite 10 is matched to that of the GaAs semiconductor to eliminate reflections at the plane of the ferrite.

Figure 2:
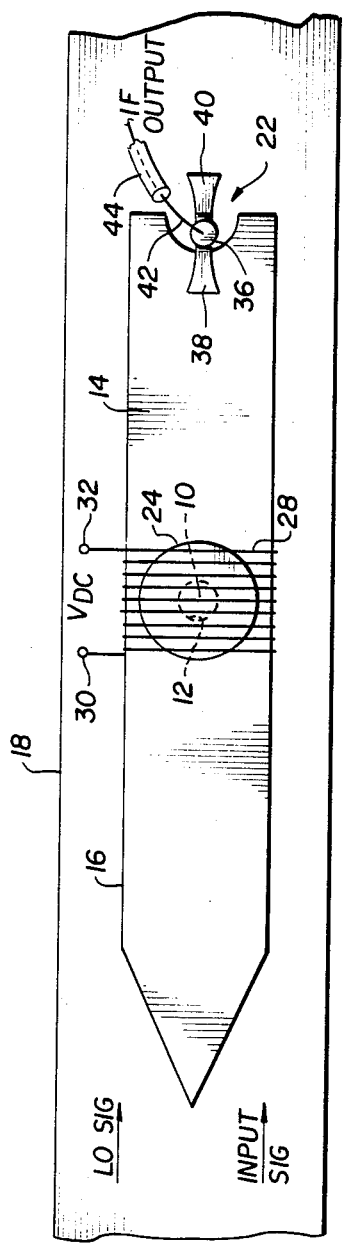
FIG. 2 is a fragmented top planar view of the preferred embodiment of the invention.
Figure 3:
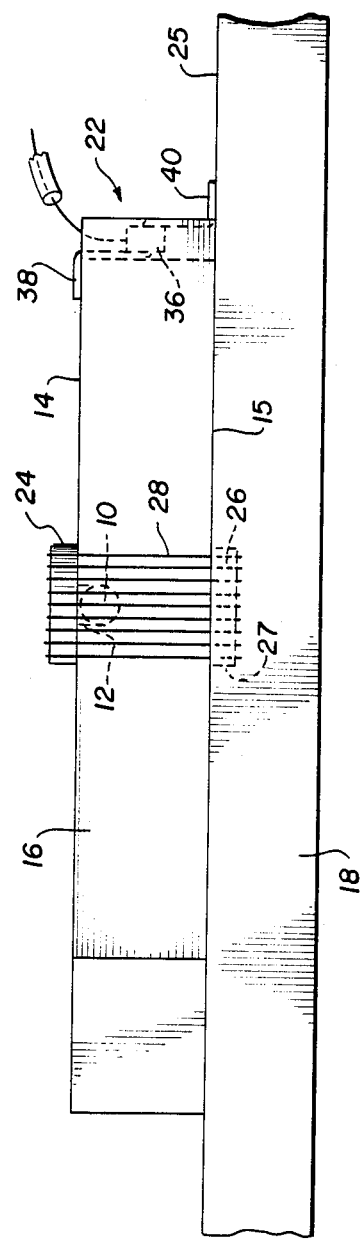
FIG. 3 is a fragmentary side planar view of the embodiment shown in FIG. 2.

The ferrite sphere 10, moreover, is biased to ferromagnetic resonance for selected absorption of a band of signals of predetermined frequencies propagating down the transmission line 16, which in the preferred embodiment shown in FIGS. 2 and 3 comprises both an input signal and a local oscillator signal which are being fed to receiving means comprising a mixer 22 located at the far end, the output end, of the dielectric waveguide element 16.

Biasing of the ferrite sphere 10 is provided by a pair of high energy rare earth permanent magnets 24 and 26 which are shown in the form of generally circular plates of uniform thickness placed against the upper and lower surfaces 14 and 15, respectively, of the GaAs transmission line element 16. Inasmuch as the dielectric waveguide element 16 is located on the upper surface 25 of the ground plane 18, a circular recess 27 is formed in the ground plane surface 25 to receive the magnet 26.

Figure 4:
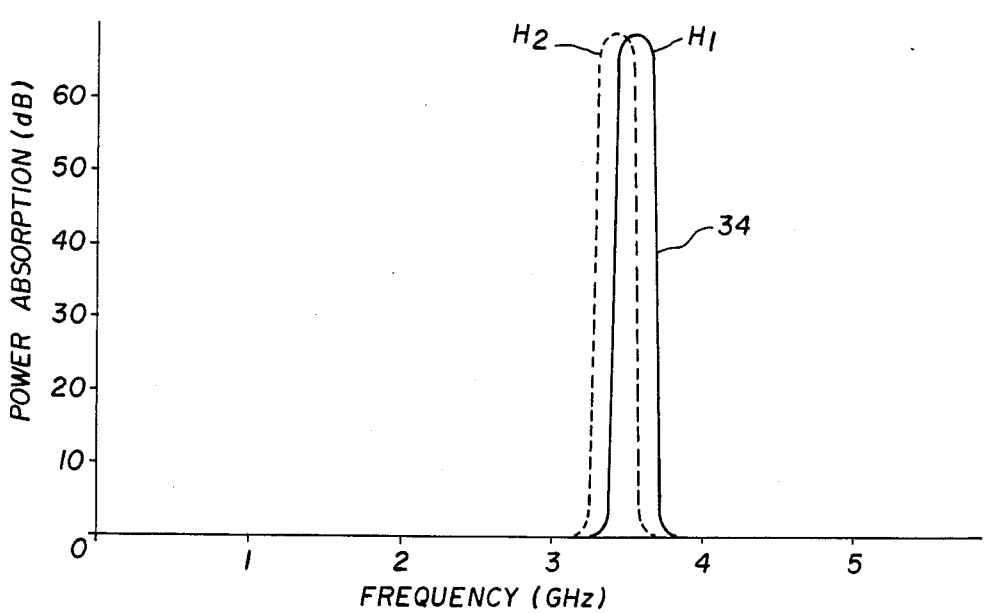
FIG. 4 is a graph illustrative of the frequency absorption characteristic exhibited by the embodiment of the invention shown in FIGS. 2 and 3.

In order to provide frequency absorption selectivity, a multi-turn tuning coil 28 is wrapped around the outer surfaces of magnets 24 and 26 as well as the exposed surfaces of the dielectric image guide 16. Although shown as discrete turns of wire, the tuning coil 28 can, when desired, be etched or integrated directly into the small rare earth magnets 24 and 26. In any event, the tuning coil 28, in whatever form it takes, is adapted to be coupled to a source of DC potential $V_{dc}$, shown in FIG. 2 being coupled across terminals 30 and 32. Variation of the applied voltage $V_{dc}$ to the tuning coil 28 will cause a change in the strength of the magnetic field H applied to the ferrite sphere 10 which in turn causes a change in the power absorption spectrum. As shown in FIG. 4, two different values of magnetic field $H_1$ and $H_2$ produced by the varying magnitude of current flowing in the tuning coil 28 result in a shift of frequency absorption curve 34.

Thus a magnetically tuned band reject filter is provided in a millimeter wave image guide transmission line device which is compatible for use with the front end of a millimeter wave frequency receiver, now shown, coupled to a mixer 22 which as shown in FIGS. 2 and 3 provides an IF output signal resulting from the heterodyne action between a local oscillator signal and an RF input signal applied to the tapered end 20 of the GaAs transmission line element 16. The mixer 22 is comprised of, for example, a Schottky barrier diode 36 having a pair of beam leads 38 and 40 coupled between the top surface 14 of the waveguide 16 and the top surface 25 of the ground plane 18. A coaxial cable comprised of an inner conductor 42 and an outer conductor 44 is coupled to the mixer diode 36 by way of the inner conductor 42, which conductor conveys an IF output signal to IF frequency circuitry, not shown.

Thus what has been shown is a high anisotropy barium ferrite sphere embedded centrally within a semiconductor image guide with the ferromagnetic resonance characteristic of the sphere being selectively tuned for selected absorption of signals propagating down the transmission line.

While there has been shown and described what is at present considered to be the preferred embodiment of the invention, it is to be noted that the same has been made by way of illustration and not limitation. Accordingly, all modifications, alterations and changes coming within the spirit and scope of the invention as set forth in the appended claims are herein meant to be included.

I claim:

1. A magnetically tunable band reject filter, comprising:
    a semi-insulating dielectric transmission medium including a length of a semiconductor material and a conductive ground plane supporting said semiconductor material;
    a body of a high anisotropy ferromagnetic material embedded in said semiconductor material and having a ferromagnetic resonance characteristic in response to a biasing magnetic field which is operative with signals within a predetermined band of millimeter wave frequencies propagating along the semiconductor material, said signals driving said ferromagnetic material body into a coupling mode causing signal energy at said band of frequencies to be absorbed while other signal frequency energy passes substantially unattenuated; and
    selectively variable magnetic field means for providing said biasing magnetic field and thereby varying the resonance frequency characteristic thereof, said magnetic field means including a pair of magnets positioned on opposite sides of said semiconductor material at the location of said ferromagnetic material, a tuning coil wound around said magnets, and a source of variable direct voltage applied across said coil for varying the current in said coil and strength of said magnetic field.

2. The band reject filter as defined by claim 1 wherein said body of ferromagnetic material is centrally embedded in said length of semiconductor material.

3. The band reject filter as defined by claim 2 wherein said body of ferromagnetic material is embedded in the top surface of said length of semiconductor material.

4. The band reject filter as defined by claim 2 wherein said body of ferromagnetic material has a dielectric constant which is matched to the dielectric constant of said semiconductor material to eliminate reflections at the plane of said body of ferromagnetic material.

5. The band reject filter as defined by claim 1 wherein said body of ferromagnetic material is embedded along the center line of said length of semiconductor material.

6. The band reject filter as defined by claim 1 wherein said semiconductor material comprises a group III-V compound.

7. The band reject filter as defined by claim 6 wherein said compound comprises gallium arsenide.

8. The band reject filter as defined by claim 1 wherein said body of ferromagnetic material is comprised of barium ferrite.

9. The band reject filter as defined by claim 1 wherein said body of ferrite material comprises a sphere of high anisotropy single crystal barium ferrite 10. The band reject filter as defined by claim 1 wherein said body of ferromagnetic material comprises a barium ferrite sphere centrally embedded in said length of semiconductor material, and wherein said semiconductor material comprises gallium arsenide.

11. The band reject filter as defined by claim 1 wherein said pair of magnets are comprised of rare earth materials.

12. The band reject filter as defined by claim 1 wherein said ground plane includes a channel in the surface adjacent said semiconductor material for receiving one of said magnets.

13. The band reject filter as defined by claim 1 wherein said semiconductor material includes a tapered input end for receiving a radio frequency input signal and a local oscillator signal.

14. The band reject filter as defined by claim 13 including a mixer diode at the output end of said semiconductor material and a pair of leads respectively connecting said diode between the top surface of said semiconductor material and the top surface of said ground plane.

* * * * *